(12) United States Patent
Ito

(10) Patent No.: US 11,249,118 B2
(45) Date of Patent: Feb. 15, 2022

(54) CURRENT SENSING CIRCUIT

(71) Applicant: ABLIC Inc., Chiba (JP)

(72) Inventor: Keisuke Ito, Chiba (JP)

(73) Assignee: ABLIC INC., Chiba (JP)

( * ) Notice: Subject to any disclaimer, the term of this patent is extended or adjusted under 35 U.S.C. 154(b) by 48 days.

(21) Appl. No.: 16/797,705

(22) Filed: Feb. 21, 2020

(65) Prior Publication Data

US 2020/0292587 A1 Sep. 17, 2020

(30) Foreign Application Priority Data

Mar. 11, 2019 (JP) .............................. JP2019-043306

(51) Int. Cl.
*G01R 19/00* (2006.01)
*G01R 15/14* (2006.01)
*H03K 17/0814* (2006.01)

(52) U.S. Cl.
CPC ....... *G01R 19/0092* (2013.01); *G01R 15/146* (2013.01); *G01R 19/0023* (2013.01); *H03K 17/08142* (2013.01)

(58) Field of Classification Search
CPC ............. G01R 19/0092; G01R 15/146; G01R 19/0023; G01R 19/16538; G01R 19/16519; H03K 17/08142; H03K 2217/0027
See application file for complete search history.

(56) References Cited

U.S. PATENT DOCUMENTS

| 5,378,998 | A | 1/1995 | Davies | |
|---|---|---|---|---|
| 2009/0179621 | A1* | 7/2009 | Kimura | G01R 19/16538 323/265 |
| 2010/0277142 | A1* | 11/2010 | Tan | H02M 7/53803 323/268 |
| 2017/0093376 | A1* | 3/2017 | Kadowaki | G05F 3/262 |
| 2019/0341848 | A1* | 11/2019 | Yonezawa | H02M 1/14 |

* cited by examiner

*Primary Examiner* — Akm Zakaria
(74) *Attorney, Agent, or Firm* — Crowell & Moring LP

(57) ABSTRACT

A current sensing circuit includes a current detection unit having a first resistance element; a first MOS-transistor and a first constant current source connected between a first output end of the current detection unit and a ground terminal; a second MOS-transistor and a second constant current source connected between a second output end of the current detection unit and the ground terminal; a third MOS-transistor having a source connected to the first output end and a gate connected to a drain of the second MOS-transistor; a second resistance element connected between an output terminal and the ground terminal; and a high withstand-voltage MOS-transistor connected between the third MOS-transistor and the output terminal to receive a predetermined control voltage, wherein the gates of the first and second MOS-transistors are commonly connected, and the gate of the first MOS-transistor is connected to the drain thereof.

8 Claims, 4 Drawing Sheets

PRIOR ART

CURRENT SENSING CIRCUIT

RELATED APPLICATIONS

This application claims priority to Japanese Patent Application No. 2019-043306 filed on Mar. 11, 2019, the entire content of which is incorporated herein by reference.

BACKGROUND OF THE INVENTION

1. Field of the Invention

The present invention relates to a current sensing circuit.

2. Description of the Related Art

FIG. 4 shows a circuit diagram of a conventional current sensing circuit 400. Such a conventional current sensing circuit is described, for example, in U.S. Pat. No. 5,378,998. The current sensing circuit 400 of FIG. 4 is an example in which MOS transistors are used instead of bipolar transistors in the current sensing circuit described in U.S. Pat. No. 5,378,998.

In the conventional current sensing circuit 400, an input terminal 401, a ground terminal 402 and an output terminal 403, a current detection unit 410 composed of resistance elements 411, 412, 413, PMOS transistors 421, 422, 423, constant current sources 431, 432, and a resistance element 440 are connected as illustrated in FIG. 4.

The gate of the PMOS transistor 421 and the gate of the PMOS transistor 422 are commonly connected and biased by the current of the constant current source 431 and the current of the constant current source 432, respectively. In the PMOS transistor 421 the gate is connected to the drain.

The PMOS transistor 421 and the PMOS transistor 422, and the resistance element 412 and the resistance element 413 are, respectively, the same elements of the same sizes and the current of the constant current source 431 coincides with the current of the constant current source 432. In this circuit configuration, the current flowing into the PMOS transistor 421 is substantially equal to the current flowing into the PMOS transistor 422 unless the current flows through the resistance element 411.

In the current sensing circuit 400 having a configuration shown above, since a potential difference between both ends of the resistance element 411 is caused by the flow of the current Is, which should be sensed, flowing from the input terminal 401 into the resistance element 411, the voltage applied to the source of the PMOS transistor 422 drops. The gate voltage of the PMOS transistor 423 thereby drops to increase the current flowing through the PMOS transistor 423 and the resistance element 440. By the current flowing through the resistance element 412, the voltage applied to the source of the PMOS transistor 421 decreases. This operation is balanced at a point where the source voltage of the PMOS transistor 421 matches the source voltage of the PMOS transistor 422.

In other words, since the PMOS transistor 423 is connected to the PMOS transistors 421 and 422 to form a negative feedback, the PMOS transistor 423 generates a negative feedback current to eliminate the imbalance between the current through the PMOS transistor 421 and the current through the PMOS transistor 422. A voltage generated by the flow of the negative feedback current through the resistance element 440 is supplied to the output terminal 403 as a voltage VOUT.

In the conventional current sensing circuit 400, since the voltage generated by the current flowing through the resistance element 440 is obtained from the output terminal 403 as the voltage VOUT corresponding to the current Is flowing from the input terminal 401 in such a state that the source voltage of the PMOS transistor 421 matches the source voltage of the PMOS transistor 422, i.e., that the operating point of the PMOS transistor 421 becomes equal to that of the PMOS transistor 422, a high-precision current sensing circuit is realized.

However, in the conventional current sensing circuit 400 described above, setting a power-supply voltage VDD supplied to the input terminal 401 to a high voltage makes the operating speed slow. In other words, setting the power-supply voltage VDD to the high voltage requires use of a high withstand-voltage PMOS transistor as the PMOS transistor 423 as illustrated in FIG. 4. Since the gate capacitance of the high withstand-voltage PMOS transistor is larger, charging/discharging of the gate capacitance of the PMOS transistor 423 takes longer. This makes the operating speed of the current sensing circuit 400 slower.

SUMMARY OF THE INVENTION

It is an object of the present invention to provide a current sensing circuit capable of operating under a high power-supply voltage at a high speed.

A current sensing circuit according to an embodiment of the present invention includes a first power-supply terminal; a second power-supply terminal; an output terminal; a current detection unit having a first resistance element with one end connected to the first power-supply terminal, a first output end connected to the one end of the first resistance element, and a second output end connected to the other end of the first resistance element; a first MOS transistor having a source connected to the first output end and a gate connected to a drain thereof; a second MOS transistor having a source connected to the second output end and a gate connected to the gate of the first MOS transistor; a first constant current source having one end connected to the drain of the first MOS transistor and another end connected to the second power-supply terminal; a second constant current source having one end connected to a drain of the second MOS transistor and another end connected to the second power-supply terminal; a third MOS transistor having a source connected to the first output end and a gate connected to the drain of the second MOS transistor; a second resistance element having one end connected to the output terminal and another end connected to the second power-supply terminal; and a fourth MOS transistor having a source connected to a drain of the third MOS transistor and a drain connected to the one end of the second resistance element, the fourth MOS transistor having a withstand voltage higher than those of the first to third MOS transistors, and configured to receive a predetermined control voltage supplied to a gate thereof.

According to the present invention, a high withstand-voltage MOS transistor is used as the fourth MOS transistor to receive a predetermined control voltage at the gate of the fourth MOS transistor so that the drain voltage of the third MOS transistor is clamped by a voltage obtained by adding a threshold voltage of the fourth MOS transistor to the control voltage, setting the voltage applied between the source and drain of the third MOS transistor to a withstand voltage of the third MOS transistor or lower even if the voltage supplied to the first power-supply terminal is a high voltage. Without using a high withstand-voltage MOS transistor as the third MOS transistor, a current sensing circuit which is able to operate under a high power-supply voltage at a high speed can thus be provided.

DETAILED DESCRIPTION OF THE PREFERRED EMBODIMENTS

A mode for carrying out the present invention will be described in detail with reference to the accompanying drawings.

Figure 1:
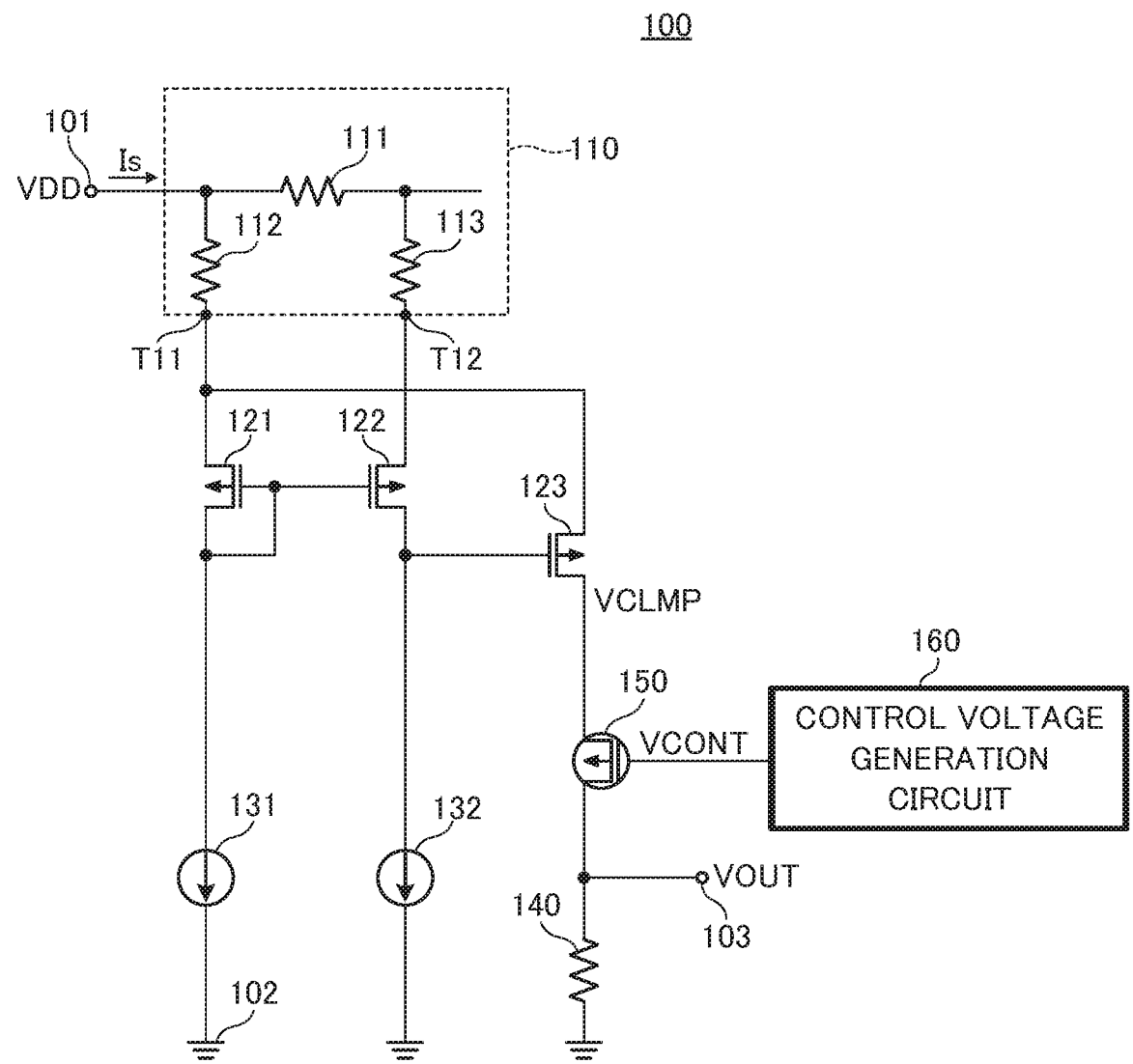
FIG. 1 is a circuit diagram illustrating a current sensing circuit of an embodiment of the present invention.

FIG. 1 is a circuit diagram illustrating a current sensing circuit 100 of an embodiment of the present invention.

The current sensing circuit 100 of the embodiment includes an input terminal (also called the "first power-supply terminal") 101; a ground terminal (also called the "second power-supply terminal") 102; an output terminal 103; a current detection unit 110 having a resistance element 111, a resistance element 112, a resistance element 113, an output end T11, and an output end T12; a PMOS transistor 121; a PMOS transistor 122; a PMOS transistor 123; a constant current source 131; a constant current source 132; a resistance element 140; a PMOS transistor 150; and a control voltage generation circuit 160.

In the current detection unit 110, one end of the resistance element 111 is connected to the input terminal 101, the output end T11 is connected to the one end of the resistance element 111 through the resistance element 112, and the output end 112 is connected to the other end of the resistance element 111 through the resistance element 113.

The PMOS transistor 121 has the source connected to the output end T11 of the current detection unit 110, and the gate connected to the drain. The PMOS transistor 122 has the source connected to the output end 112 of the current detection unit 110, and the gate is connected to the gate of the PMOS transistor 121.

The constant current source 131 has one end connected to the drain of the PMOS transistor 121, and the other end connected to the ground terminal 102. The constant current source 132 has one end connected to the drain of the PMOS transistor 122, and the other end connected to the ground terminal 102.

The PMOS transistor 123 has the source connected to the output end T11 of the current detection unit 110, and the gate is connected to the drain of the PMOS transistor 122. The resistance element 140 has one end connected to the output terminal 103, and the other end connected to the ground terminal 102.

The PMOS transistor 150 has the gate connected to the output of the control voltage generation circuit 160, the source connected to the drain of the PMOS transistor 123, and the drain connected to the one end of the resistance element 140. The PMOS transistor 150 has a withstand voltage higher than those of the PMOS transistors 121, 122, 123.

The operation of the current sensing circuit 100 constructed as mentioned above will next be described.

Since a potential difference between both ends of the resistance element 111 is caused by the flow of the current Is, which should be sensed, flowing from the input terminal 101 into the resistance element 111, the voltage applied to the source of the PMOS transistor 122 drops. The gate voltage of the PMOS transistor 123 thereby drops.

On the other hand, since a predetermined control voltage VCONT is supplied from the control voltage generation circuit 160 to the gate of the high withstand-voltage PMOS transistor 150, the PMOS transistor 150 is in the on state.

The current flowing through the PMOS transistor 123, the PMOS transistor 150, and the resistance element 140 increases due to the drop of the gate voltage of the PMOS transistor 123. By the current flowing through the resistance element 112, the voltage applied to the source of the PMOS transistor 121 decreases. This operation is balanced at a point where the source voltage of the PMOS transistor 121 matches the source voltage of the PMOS transistor 122. In other words, since the PMOS transistor 123 is connected to the PMOS transistors 121 and 122 to form a negative feedback, the PMOS transistor 123 generates a negative feedback current to eliminate the imbalance between the current through the PMOS transistor 121 and the current through the PMOS transistor 122.

By the flow of the negative feedback current through the resistance element 140, a voltage is generated at one end of the resistance element 140 and is supplied to the output terminal 103 as a voltage VOUT.

According to the current sensing circuit 100 of the embodiment, the voltage VOUT corresponding to the current flowing from the input terminal 101 can be obtained from the output terminal 103.

Here, in the embodiment, a power-supply voltage VDD supplied to the input terminal 101 is a high voltage, and a control voltage VCONT supplied from the control voltage generation circuit 160 is set to a voltage such that the difference from the power-supply voltage VDD is relatively small. The drain voltage of the PMOS transistor 123 is clamped by the voltage VCLMP obtained by adding the absolute value of the threshold voltage |VTPH| of the PMOS transistor 150 to the control voltage VCONT as in Equation (1) below.

$$VCLMP = VCONT + |VTPH| \quad (1)$$

For example, if the power-supply voltage VDD is 12 V, the control voltage VCONT is 7 V, and the absolute value |VTPH| of the threshold voltage of the PMOS transistor 150 is 1 V, the drain voltage VCLMP of the PMOS transistor 123 becomes 8 V.

Since the current flowing through the resistance element 112 of the current detection unit 110 is set to be minute, the voltage at the output end T11 of the current detection unit 110 becomes about 12 V substantially equal to the power-supply voltage VDD, and hence the voltage between the source and drain of the PMOS transistor 123 becomes about 4 V. In other words, if the withstand voltage between the source and drain of the PMOS transistor 123 is 4 V, the PMOS transistor 123 is protected without being broken.

According to the embodiment, since the high withstand-voltage PMOS transistor 150 is inserted between the PMOS transistor 123 and the resistance element 140 to supply an appropriate voltage to the gate of the PMOS transistor 150 according to the magnitude of the power-supply voltage VDD, the source-drain voltage of the PMOS transistor 123 can be set lower than the withstand voltage. This eliminates the need to use a high withstand-voltage PMOS transistor as the PMOS transistor 123.

If the power-supply voltage VDD is a high voltage, there is a need to use a high withstand-voltage PMOS transistor as the PMOS transistor 150 since the high voltage is applied between the source and drain of the PMOS transistor 150. However, even though the gate capacitance of the PMOS transistor 150 is large, this does not lead to decrease of the operating speed since the voltage is always supplied from the control voltage generation circuit to the gate of the PMOS transistor 150.

According to the embodiment, a current sensing circuit capable of operating reliably at a high speed even in a high case of the power-supply voltage VDD can be realized.

Figure 2:
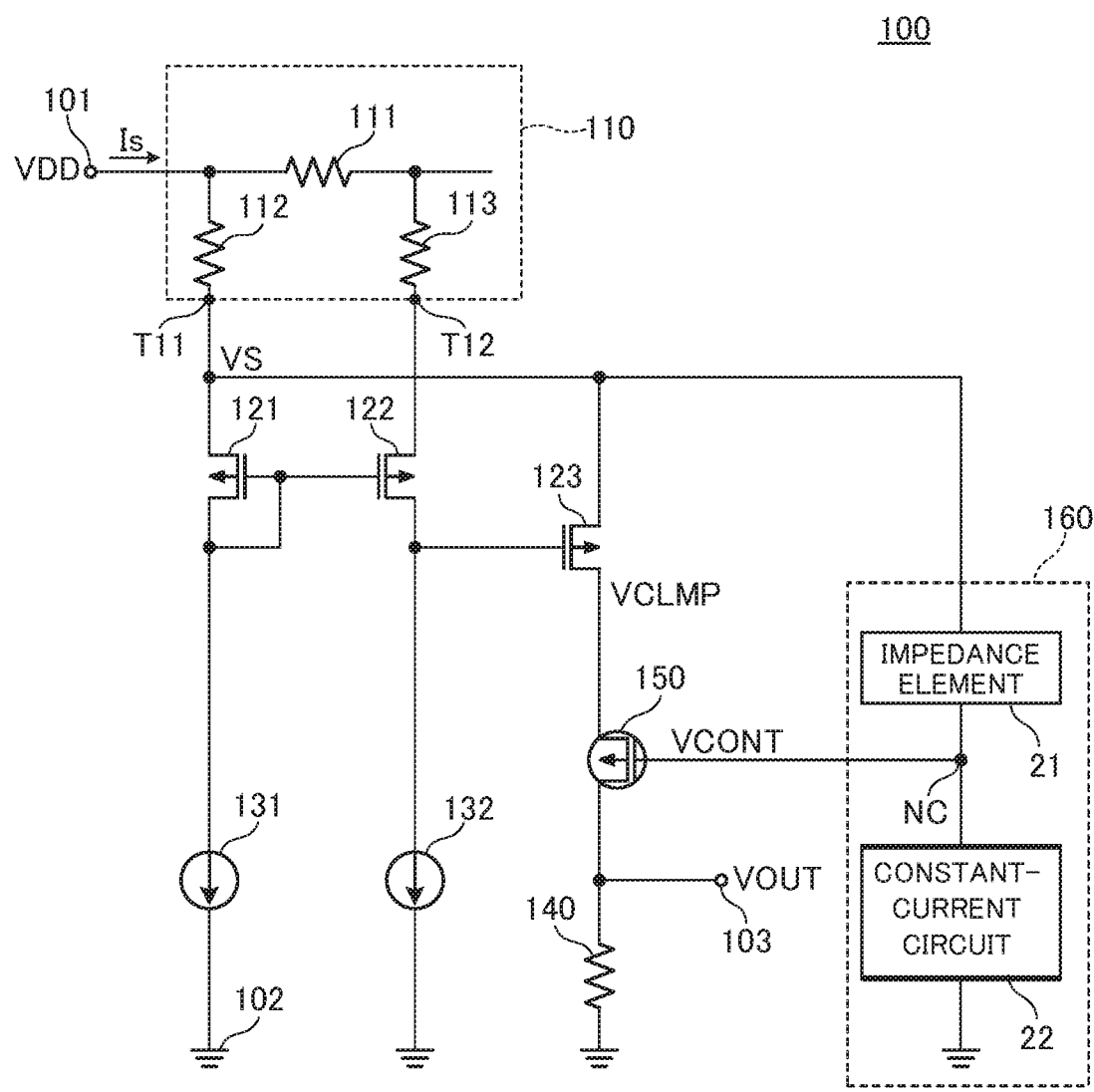
FIG. 2 is a circuit diagram illustrating a specific example of a control voltage generation circuit in the current sensing circuit of FIG. 1.

Referring next to FIG. 2, a specific example of the control voltage generation circuit 160 in the current sensing circuit 100 of FIG. 1 will be described. In FIG. 2, the same elements as those in the current sensing circuit 100 of FIG. 1 are given the same reference numbers to omit redundant description.

As illustrated in FIG. 2, the control voltage generation circuit 160 in the specific example includes an impedance element 21 and a constant current circuit 22.

The impedance element 21 and the constant current circuit 22 are connected in series between the output end T11 of the current detection unit 110 and the ground terminal 102 so that a voltage generated at a connection node NC of both is a control voltage VCONT supplied to the gate of the PMOS transistor 150.

According to the above configuration, since the impedance element 21 receives the voltage at the output end T11 as an input to generate the control voltage VCONT, the control voltage generation circuit 160 can easily generate the above-mentioned control voltage VCONT whose difference from the power-supply voltage VDD which is a high voltage is relatively small.

Figure 3:
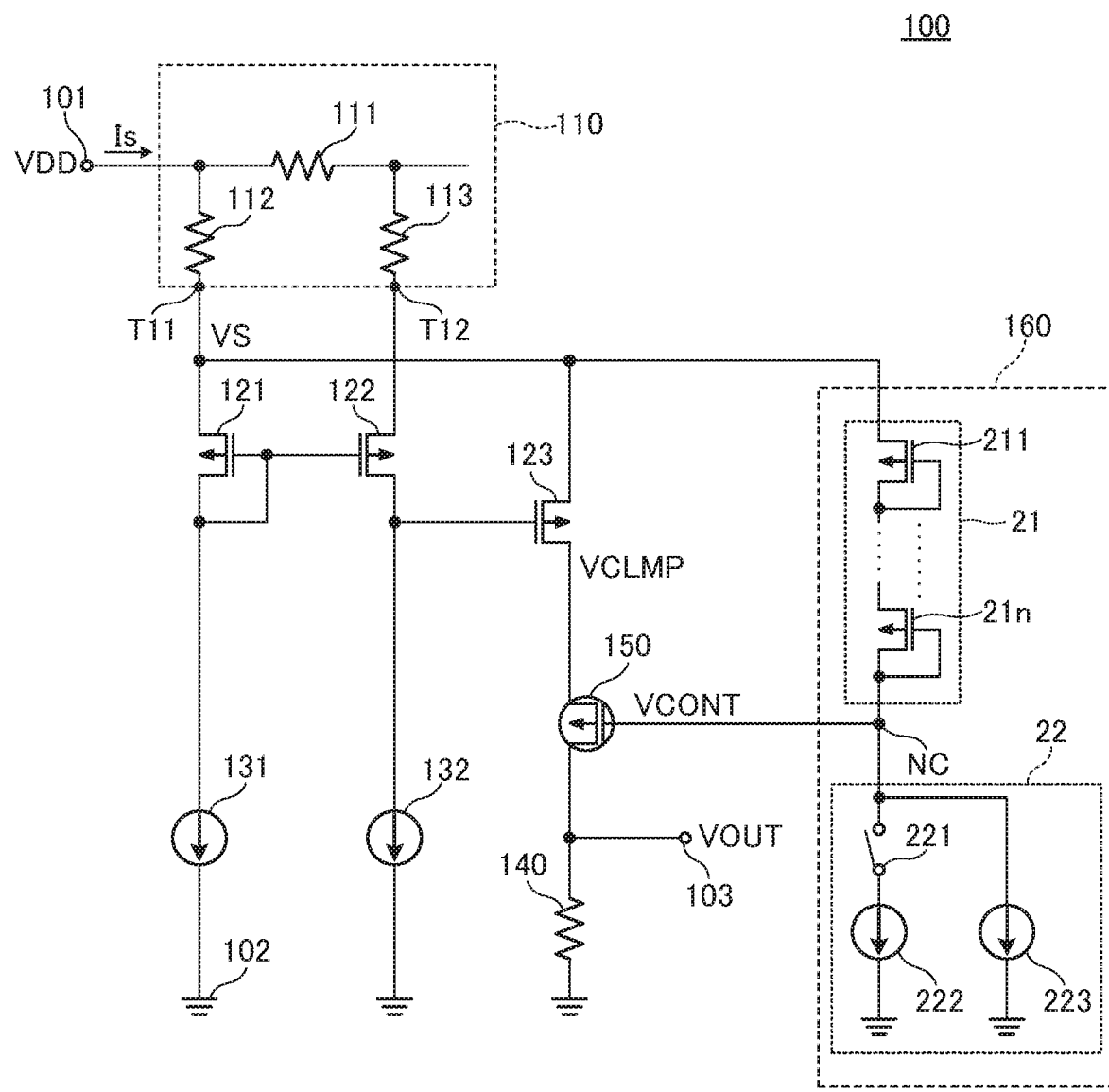
FIG. 3 is a circuit diagram illustrating a specific example of an impedance element and a constant current circuit in the control voltage generation circuit of FIG. 2.
Figure 4:
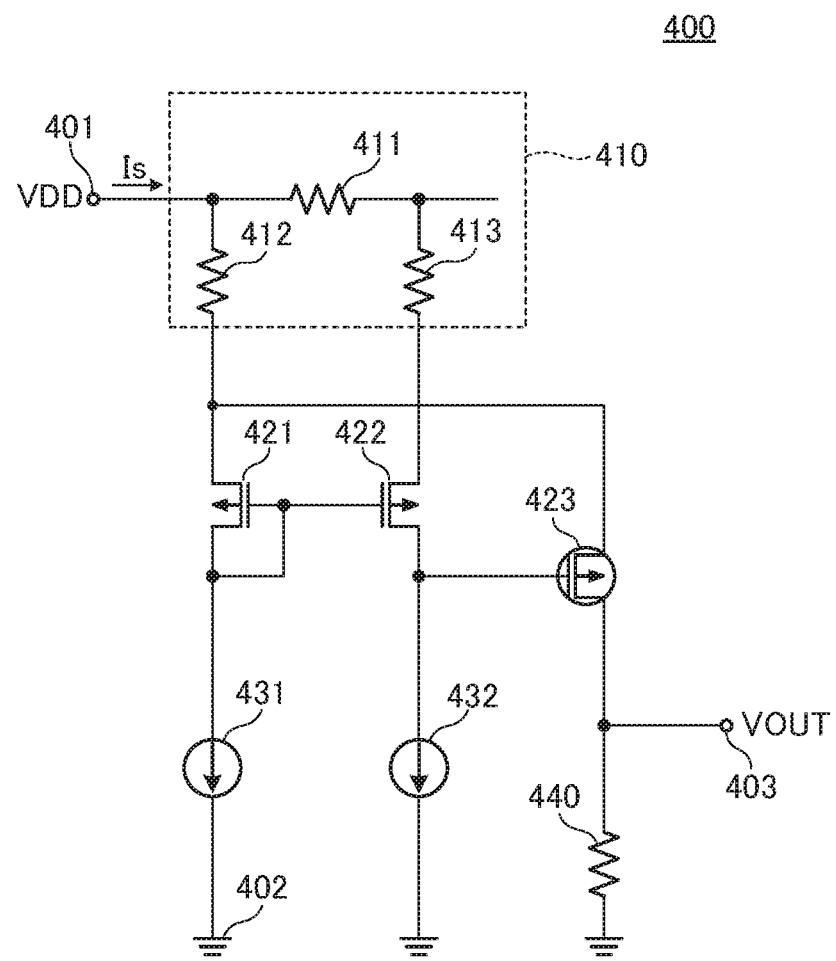
FIG. 4 is a circuit diagram of a conventional current sensing circuit.

Referring next to FIG. 3, a specific example of the impedance element 21 and the constant current circuit 22 in the control voltage generation circuit 160 of FIG. 2 will be described. In FIG. 3, the same elements as those in the current sensing circuit 100 illustrated in FIG. 1 and FIG. 2 are given the same reference numerals to omit redundant description.

As illustrated in FIG. 3, the impedance element 21 in the control voltage generation circuit 160 of this specific example is composed of an n PMOS transistors 211 to 210+n connected in series between the output end T11 of the current detection unit 110 and the connection node NC, The number of PMOS transistor 211 to 210+n can be determined according to the voltage of the power-supply voltage VDD, the source-drain withstand voltage of the PMOS transistor 123, and the absolute value of the threshold voltage of the PMOS transistor 150. For example, as in the example described above, in the case where the power-supply voltage VDD is 12 V, the source-drain withstand voltage of the PMOS transistor 123 is 4 V, and the absolute value of the threshold voltage of the PMOS transistor 150 is 1 V, if a voltage drop in one of the diode-connected PMOS transistors that constitute the impedance element 21 is 1 V, the impedance element 21 may be composed of five diode-connected PMOS transistors 211 to 215. In this case, the control voltage VCONT can be set to 7 V lower by 5 V than the 12 V of the power-supply voltage VDD, and the drain voltage VCLMP of the PMOS transistor 123 can be set to 8 V.

Further, as illustrated in FIG. 3, the constant current circuit 22 in the control voltage generation circuit 160 of the specific example is composed of a switch 221 and a constant current source 222 connected in series between the connection node NC and the ground terminal 102, and a constant current source 223 connected between the connection node NC and the ground terminal 102. Then, the current of the constant current source 223 is set very smaller than the current of the constant current source 222.

The operation of the constant current circuit 22 in the specific example will be described below.

The current Is is supplied from the input terminal 101 to the resistance element 111 to turn on the switch 221 during normal operation in which this current is sensed. In this case, the voltage at the connection node NC is determined by the total current of the constant current source 222 and the constant current source 223. This total current is set so that the voltage at the connection node NC becomes the predetermined control voltage VCONT.

During stop of operation where no input current is sensed, the switch 221 is turned off. In this case, the voltage at the connection node NC is determined by the current of the constant current source 223 alone. The current of this constant current source 223 is set small enough only to charge the gate of the high withstand-voltage PMOS transistor 150.

In the constant current circuit 22 of the specific example, the current used to determine the voltage of the connection node NC is switchable depending on the state of the switch 221. In other words, a flow of a current small enough only to charge the gate capacitance of the high withstand-voltage PMOS transistor 150 is made by the constant current source 223 in advance during stop of operation, and the constant current source 222 is connected by the switch 221 at the startup of the current sensing circuit 100 to start normal operation in order to obtain a current necessary to generate the predetermined control voltage VCONT, thereby permitting reduction of the current consumption during stop of operation while ensuring the startup speed of the current sensing circuit 100.

While the embodiment of the present invention has been described above, the present invention is not limited to the above-described embodiment, and it is needless to say that various changes can be made without departing from the scope of the present invention.

For example, in the above-described embodiment, the example in which the control voltage VCONT to be supplied to the gate of the high withstand-voltage PMOS transistor 150 is generated by the control voltage generation circuit 160 is illustrated, but the present invention is not limited thereto. The control voltage VCONT may be supplied directly from an external terminal.

Further, in the above-mentioned embodiment, the example in which all the MOS transistors are constructed by using PMOS transistors is illustrated, but the structure can also be obtained by replacing all the PMOS transistors by NMOS transistors, and inverting the input terminal 101, the ground terminal 102, and other connections.

What is claimed is:
1. A current sensing circuit, comprising:
a first power-supply terminal;
a second power-supply terminal;
an output terminal;
a current detection unit having a first resistance element with one end connected to the first power-supply terminal, a first output end connected to the one end of the first resistance element, and a second output end connected to another end of the first resistance element;

a first MOS transistor having a source connected to the first output end and a gate connected to a drain thereof;

a second MOS transistor having a source connected to the second output end and a gate connected to the gate of the first MOS transistor;

a first constant current source having one end connected to the drain of the first MOS transistor and another end connected to the second power-supply terminal;

a second constant current source having one end connected to a drain of the second MOS transistor and another end connected to the second power-supply terminal;

a third MOS transistor having a source connected to the first output end and a gate connected to the drain of the second MOS transistor;

a second resistance element having one end connected to the output terminal and another end connected to the second power-supply terminal; and a fourth MOS transistor having a source connected to a drain of the third MOS transistor and a drain connected to the one end of the second resistance element, the fourth MOS transistor having a withstand voltage higher than those of the first to third MOS transistors, and configured to receive a predetermined control voltage to a gate thereof.

2. The current sensing circuit according to claim 1, further comprising a control voltage generation circuit configured to generate the predetermined control voltage.

3. The current sensing circuit according to claim 2, wherein:

the control voltage generation circuit comprises an impedance element and a constant current circuit connected in series between the first output end and the second power-supply terminal; and the predetermined control voltage is generated at a connection point between the impedance element and the constant current circuit.

4. The current sensing circuit according to claim 3, wherein the impedance element comprises at least one diode-connected fifth MOS transistor.

5. The current sensing circuit according to claim 3, wherein the constant current circuit comprises:

a switch with one end connected to the connection point;

a third constant current source connected between the other end of the switch and the second power-supply terminal; and a fourth constant current source connected between the connection point and the second power-supply terminal.

6. The current sensing circuit according to claim 4, wherein the constant current circuit comprises:

a switch with one end connected to the connection point;

a third constant current source connected between the other end of the switch and the second power-supply terminal; and a fourth constant current source connected between the connection point and the second power-supply terminal.

7. The current sensing circuit according to claim 5, wherein a current of the fourth constant current source is smaller than a current of the third constant current source.

8. The current sensing circuit according to claim 6, wherein a current of the fourth constant current source is smaller than a current of the third constant current source.

* * * * *